US011086031B1

(12) United States Patent
Gu et al.

(10) Patent No.: US 11,086,031 B1
(45) Date of Patent: Aug. 10, 2021

(54) RADIATION IMAGE DETECTOR

(71) Applicant: IRAY TECHNOLOGY COMPANY LIMITED, Shanghai (CN)

(72) Inventors: Tieer Gu, Shanghai (CN); Zhongshou Huang, Shanghai (CN)

(73) Assignee: IRAY TECHNOLOGY COMPANY LIMITED, Shanghai (CN)

( * ) Notice: Subject to any disclaimer, the term of this patent is extended or adjusted under 35 U.S.C. 154(b) by 0 days.

(21) Appl. No.: 16/899,618

(22) Filed: Jun. 12, 2020

(30) Foreign Application Priority Data

Jan. 21, 2020 (CN) .......................... 202010072176.3

(51) Int. Cl.
*H01L 27/146* (2006.01)
*G01T 1/20* (2006.01)

(52) U.S. Cl.
CPC ........ *G01T 1/20185* (2020.05); *G01T 1/2002* (2013.01); *H01L 27/14625* (2013.01)

(58) Field of Classification Search
CPC .............. G01T 1/2002; G01T 1/20185; H01L 27/14625
See application file for complete search history.

(56) References Cited

U.S. PATENT DOCUMENTS

| 2011/0242349 | A1* | 10/2011 | Izuha ................ H01L 27/14621 348/222.1 |
| 2016/0021319 | A1  | 1/2016  | Okamoto et al. |
| 2017/0234992 | A1* | 8/2017  | Miyazawa ........ H01L 27/14625 257/432 |
| 2020/0058684 | A1* | 2/2020  | Wu ................... H01L 27/14603 |

FOREIGN PATENT DOCUMENTS

EP      2383586 A1      11/2011

OTHER PUBLICATIONS

European Search Report for EP20197625, dated Mar. 12, 2021.

* cited by examiner

*Primary Examiner* — Mark R Gaworecki
(74) *Attorney, Agent, or Firm* — Blue Filament Law PLLC (57) ABSTRACT

A radiation image detector is provided. The radiation image detector includes: a substrate, an optical image detector located on the substrate and including an array including photosensitive pixels, a radiation conversion layer, and pixelated light-collecting structures located between the photosensitive pixels and the radiation conversion layer and configured to guide visible light that would fall into a trench region or a side wall region to a central region. Each photosensitive pixel includes a first electrode including a first contact surface in direct contact with the photoelectric conversion layer, a photoelectric conversion layer including the central region and the side wall region, and a second electrode including a second contact surface in direct contact with the photoelectric conversion layer.

7 Claims, 6 Drawing Sheets

FIG. 1

(Prior Art)

RADIATION IMAGE DETECTOR

CROSS-REFERENCE TO RELATED APPLICATIONS

The present application is based upon and claims the benefit of priority of Chinese Patent Application No. 202010072176.3, filed on Jan. 21, 2020, the entire contents of which are incorporated herein by reference.

TECHNICAL FIELD

The present disclosure pertains generally to the field of radiation detectors and, more particularly, to the field of radiation image detectors.

BACKGROUND

Flat panel X-ray image detectors have been widely used in digital radiography for medical diagnosis and radiotherapy. Compared with traditional X-ray films, the flat panel image detector has the advantages of fastness, low cost, low exposure, high image quality, etc., and is convenient for data archiving, transmission and image processing, and is readily integrated into PACS (Picture Archiving and Communication Systems).

An image detector in the related art is provided with a radiation conversion layer and a visible light image detector. First, the radiation is converted to visible light through the radiation conversion layer; then the visible light is converted to electrical signals through a photoelectric conversion device in the visible light image detector; and finally the electrical signals are readout to an external circuit to complete the detection of the radiation image. With increase of clinic adoption of the flat panel X-ray detectors, the demand for higher image quality is increasing. The image quality is characterized by detective quantum efficiency (DQE) or alternatively modulation transfer function (MTF) and signal to noise ratio (SNR). Therefore increase MTF and SNR is the primary object of this disclosure.

SUMMARY

Embodiments of the present disclosure provide a radiation image detector, which improves light utilization of the image detector and therefore increases image MTF and SNR.

In a first aspect, an embodiment of the present disclosure provides a radiation image detector, the radiation image detector includes a substrate, an optical image detector located on the substrate and including an array including a plurality of photosensitive pixels arranged periodically, a radiation conversion layer located on a side of the optical image detector facing away from the substrate and configured to convert radiation into visible light, and a plurality of light-collecting structures. Each photosensitive pixel of the plurality of photosensitive pixels includes a first electrode, a photoelectric conversion layer, and a second electrode. The first electrode includes a first contact surface in direct contact with the photoelectric conversion layer, the second electrode includes a second contact surface in direct contact with the photoelectric conversion layer, and the photoelectric conversion layer includes a central region and a side wall region. The central region includes a portion where an orthographic projection of the first contact surface onto the photoelectric conversion layer and an orthographic projection of the second contact surface onto the photoelectric conversion layer overlap with each other, and the side wall region includes a region of the photoelectric conversion layer other than the central region. The optical image detector also includes a plurality of trench regions in a certain width, insensitive to light and surrounding the plurality of photosensitive pixels of the array. Each of the plurality of light-collecting structures is pixelated and located between the plurality of photosensitive pixels and the radiation conversion layer, and is configured to guide visible light to the central region, that the visible light would otherwise fall into the side wall region or a trench region between each photosensitive pixels.

A portion of light generated in the radiation conversion layer may enter into the trench region where no light detector exists, or enter into side-wall region in a light detector where electric field is not strong enough to drive photo-generated charges to the corresponding electrodes. The light-collecting structure provided in the present disclosure deflects and guides the portion of the light that would enter into the trench region or the side wall region, into the central region of the light detector, which ensures approximately all light photons are converted into electron-hole pairs and nearly all the electron-hole pairs are separated and collected by the electrodes.

BRIEF DESCRIPTION OF DRAWINGS

These and other features, aspects, and advantages of the present disclosure will become better understood when the following description is read with reference to the accompanying drawings in which like characters represent like parts throughout the drawings, wherein.

DESCRIPTION OF EMBODIMENTS

In order to make the features, aspects and advantages of the present disclosure better understood, the technical solutions of the present disclosure will be described in details below with reference to the accompanying drawings. It should be noted that the described embodiments are merely a part of implementations of the present disclosure, rather than all of the implementations or varieties based upon the concept disclosed in the present disclosure. All other embodiments obtained by those skilled in the art without creative efforts according to the embodiments of the present disclosure shall fall within the scope of the present disclosure.

The terms used in the embodiments of the present disclosure is for the purpose of describing particular embodiments only and are not intended to limit the present disclosure. The terms in singular forms "a" "the" and "said" used in the embodiments of the present disclosure and the appended claims are also intended to include plural forms, unless the context clearly indicates other meanings.

Figure 1:
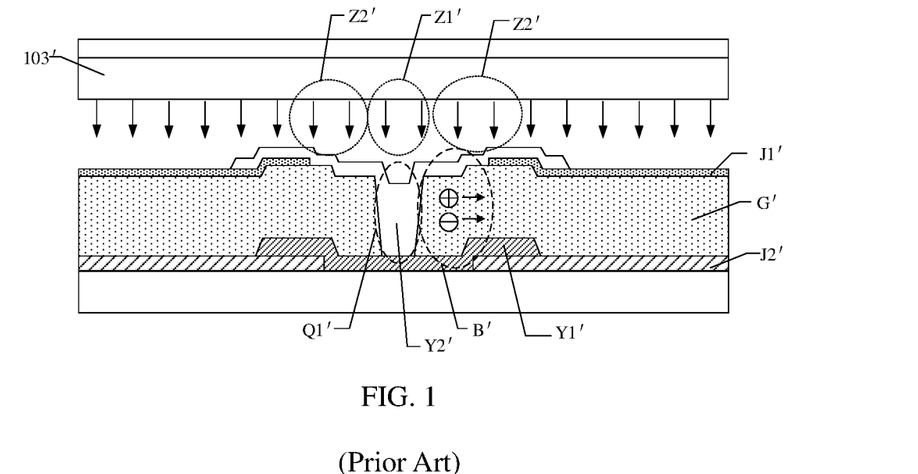
FIG. 1 is a prior art of a typical flat panel radiation image detector.

FIG. 1 is a cross-sectional view of a radiation image detector in a prior art. As shown in FIG. 1, two photosensitive pixels and a spacing region Q1' between them are illustrated. Incident radiation is converted into visible light first by a radiation conversion layer 103', and then the visible light enters into an image detector below the conversion layer 103'. As illustrated in FIG. 1, visible light emitted from a region Z1' right above the spacing region Q1' may not enter into the photoelectric conversion layer G', resulting in a reduced utilization of the visible light. In addition to the loss of the visible light from the region Z1', light emitted from a region Z2', which is right above an edge region B' of the photoelectric conversion layer G', may not contribute to image signal fully as well. As illustrated in FIG. 1, the photoelectric conversion layer G' is sandwiched by an upper electrode J1' and a bottom electrode J2', with exception around the edge of the photoelectric conversion layer, marked as the edge region B'. The photoelectric conversion layer G' may comprise (not shown in FIG. 1) an N-doped layer and a P-doped layer at the top and bottom surfaces, to server as Ohmic contact with the top electrode J1' and the bottom electrode J2', respectively. As a consequence, due to high resistance of the thin doped layers or simply due to lack of contact electrodes in the edge region B', the electric field in the edge region B' is not strong enough to either separate the electron-hole pairs generated in the edge region B', nor pull the electrons or holes to the corresponding electrodes. Electron-hole pairs will recombine quickly, resulting zero contribution to image signal. Another detrimental effect associated with this zero or low bias condition in the edge region B' is short term to long term image lags. As schematically illustrated in FIG. 1, electrons or holes generated in the edge area B' must travel laterally a longer distance relatively to the thickness of the photoelectric conversion layer G', to the upper electrode J1' or the bottom electrode J2'. The electrons or holes (i.e., photo-generated carriers) have a higher probability of being captured by various energy traps during such a long journey. Releasing of the captured charge carriers in subsequent image frames becomes a source of image lags. Therefore, the device structure in the edge region B in the prior arts not only has a reduced photoelectric conversion efficiency but also has a detrimental effect to the image quality.

One of the reasons that both the top electrode J1 and the bottom electrode J2 have recesses from the edge of the photoelectric conversion layer (or photodiode island after lithography patterning), is to avoid high sidewall leakage current. Manufacturing process in minimum dimension, caused mainly by accuracy of lithography process, will determine the minimum width of the recess from the edge of the photoelectric layer. Therefore the above described drawbacks, including the loss of signal and image lags, are always associated with the device structure in the prior arts unless a new structure is introduced.

Micro-lens array has been employed in CCDs and CMOS imaging sensors, which are made on tiny silicon chips with pixel dimensions less than 10 um. In the solution, one micro-lens having substantially the same size as each pixel is fabricated above each pixel to guide or focus all the light to the photodiode in the CCD or the CMOS imaging sensor. However, given the pixel size in a flat panel X-ray image detector, which can be as large as 100 um or even 200 μm, the height of each micro-lens would be in the same order of magnitude of pixel size to perform as a convex lens. This requirement leads to a great challenge in manufacturing process.

In order to overcome the drawbacks mentioned above, a radiation image detector comprising a pixelated light-collecting structure is conceived and disclosed in details in the following.

Figure 2:
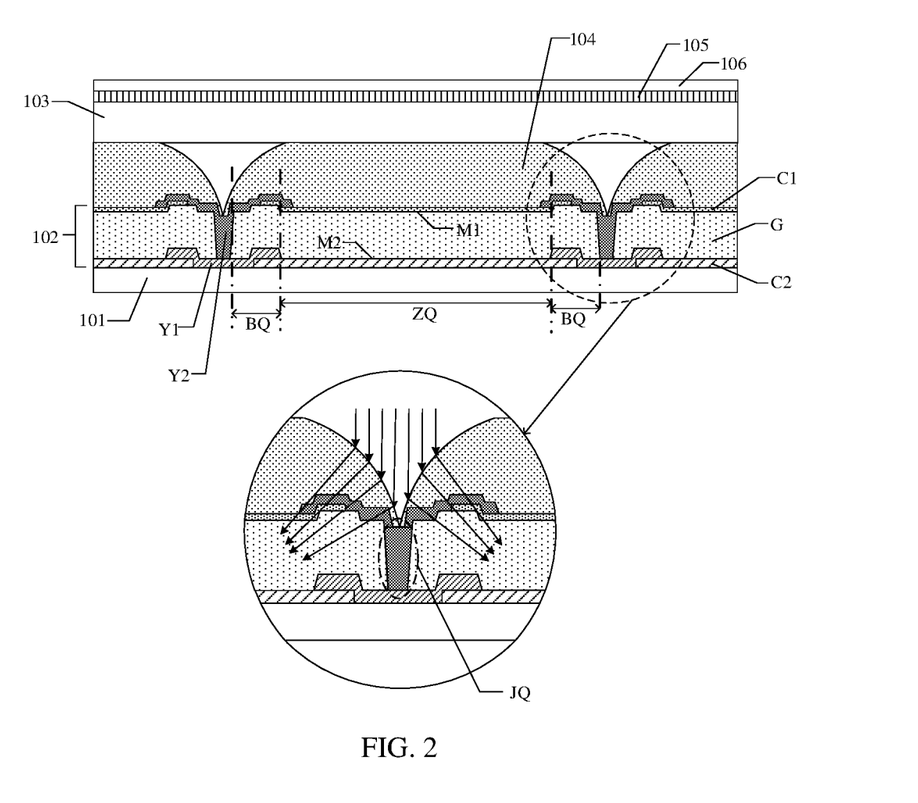
FIG. 2 is a cross-sectional view of a radiation image detector according to an embodiment of the present disclosure.
Figure 3:
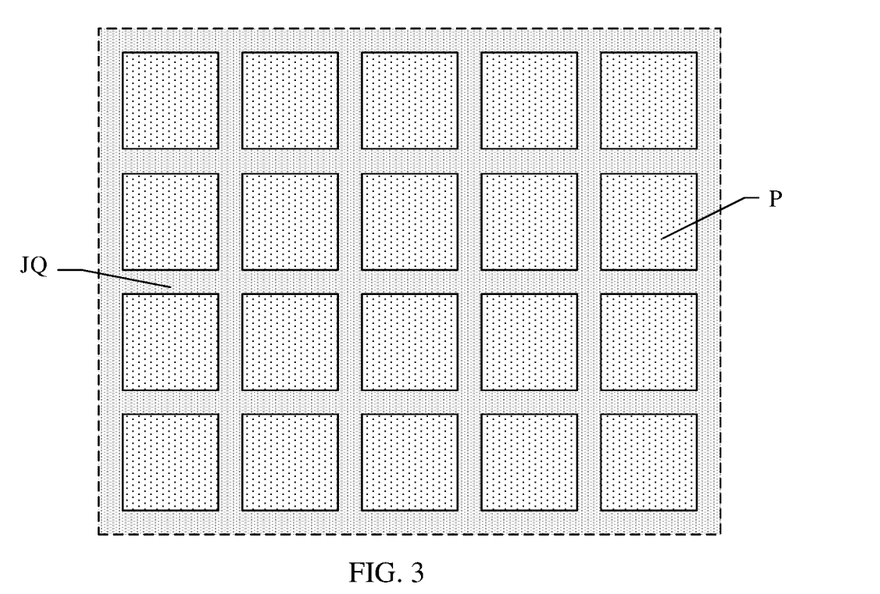
FIG. 3 is a plane view of a photosensitive pixel array in a radiation image detector according to an embodiment of the present disclosure.

FIG. 2 is a cross-sectional view of a radiation image detector according to an embodiment of the present disclosure. FIG. 3 is a plane view of a photosensitive pixel array in the radiation image detector shown in FIG. 2.

As shown in FIG. 2, the radiation image detector includes a substrate 101, and an optical image detector 102 located on the substrate 101. In an embodiment, the substrate 101 can be a flexible substrate or a rigid substrate.

The optical image detector 102 includes an array of photosensitive pixels P, arranged periodically. As shown in t FIG. 3, each photosensitive pixel P is surrounded by a trench region JQ (spacing region), which is insensitive to light. The width of the trench region JQ is generally defined by the accuracy of the manufacturing process, the size of the substrate 101, and the resolution requirements of the radiation image detector.

As shown in FIG. 2, the photosensitive pixel P includes a first electrode C1, a photoelectric conversion layer G, and a second electrode C2. The first electrode C1 includes a first contact surface M1 that is in direct contact with the photoelectric conversion layer G, and the second electrode C2 includes a second contact surface M2 that is in direct contact with the photoelectric conversion layer G.

The photoelectric conversion layer G can be divided into at least two portions, a central region ZQ and a side wall region BQ. The central region ZQ includes a portion where an orthographic projection of the first contact surface M1 onto the photoelectric conversion layer G and an orthographic projection of the second contact surface M2 onto the photoelectric conversion layer G overlap with each other. The side wall region BQ surrounds the central region ZQ. When a bias voltage is applied to the first electrode C1 or the second electrode C2, electron-hole pairs generated in the central region ZQ will be separated, and the electrons and holes will drift to the anode and the cathode, respectively.

The radiation image detector further includes a radiation conversion layer 103 overlaid on the entire optical image detector, and an array of light-collecting structure 104 (pixelated light-collecting structure). The radiation conversion layer 103 is positioned above the optical image detector 102 and configured to convert radiation into visible light. The radiations can be X-rays with energy ranging from 1 KeV to several hundred KeV or γ (Gamma) rays which may have higher energy exceeding 1 MeV in energy distribution. The radiation conversion layer 103 comprises scintillator or phosphors, such as cesium iodide (doped with Thallium CsI(Tl), or CdWO4 or GOS (Gd2O2S:Pr).

The pixelated light-collecting structure 104 is sandwiched by the photosensitive pixel P and the radiation conversion layer 103, and particularly has a curved surface near the edge of the pixel and convex toward the radiation conversion layer. As shown in the enlarged view in FIG. 2, the visible light that would fall into the trench region JQ or all into the side wall region BQ is then guided to the central region ZQ by the curved surface on the light-collecting structure 104.

Benefiting from the light-collecting structure, photoconversion efficiency is improved and so does the image lag performance.

With increase of resolution in the flat panel X-ray imaging sensor, the pixel size will be reduced accordingly, but the trench area and the side-wall region may not be downsized in the same scale, mainly due to lithography and various process limitations. Implementation of the light-collecting structure as disclosed in the embodiment into high resolution radiation image detector will have more significant improves in efficiency and image quality.

It should be noted that the radiation image detector further includes an external circuit. The external circuit is electrically connected to the photosensitive pixels. The electrical signals corresponding to the photo-generated charges in each pixel is readout by the external circuit. The external circuit is configured to perform arithmetic processing on the electric signals and then generate images according to the incident radiation on the flat panel detector.

As illustrated in FIG. 2, the radiation image detector further includes a reflective layer 105 and a cover plate 106. The reflective layer 105 is located on a side of the radiation conversion layer 103 facing away from the optical image detector 102, and the cover plate 106 is located on a side of the reflective layer 105 facing away from the radiation conversion layer 103. The cover plate 106 is made of light mass materials that can be easily penetrated by radiation, such as a carbon fiber thin plate or an aluminum alloy plate. The cover plate 106 can be a flat cover plate or a curved cover plate. The reflective layer 105 is made of materials with high reflection for visible light, such as aluminum or silver in the forms of thin film or nano particles.

As illustrated in FIG. 2, for the purpose of reducing side-wall leakage, the trench region JQ is filled with the second insulating layer Y2 to isolate the photoelectric conversion layer from its neighbors. The peripheral of the second electrode C2 is guarded by the first insulating layer Y1, defining an opening of the first insulating layer Y1, the area of the second contact surface M2, and the boundary of the central region ZQ as well. For the same purpose of reducing side-wall leakage, both the first and the second electrode Y1 and Y2 have lateral recesses from the edges of the photoelectric conversion layer G.

Figure 4:
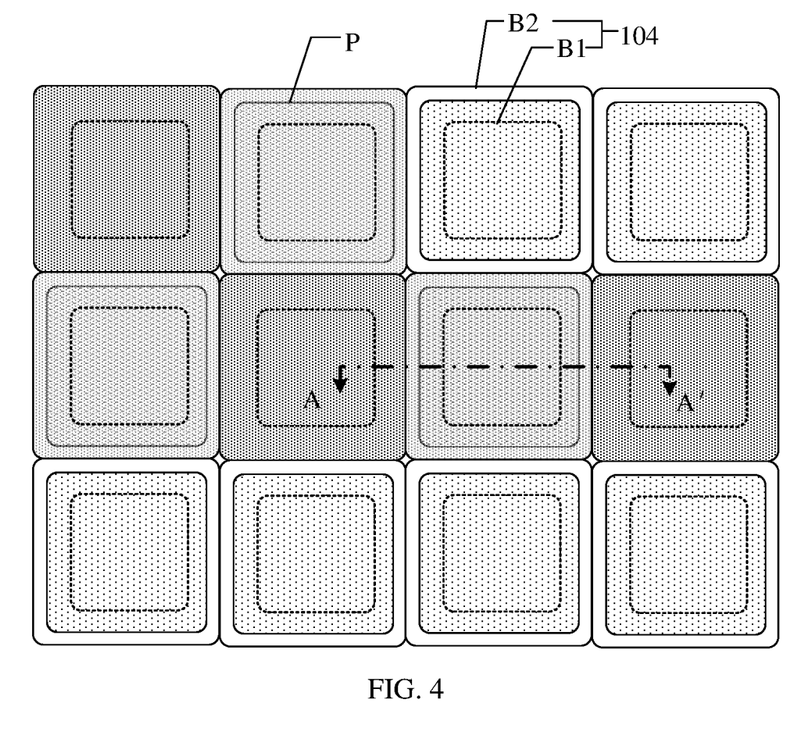
FIG. 4 is a plane view of a radiation image detector according to an embodiment of the present disclosure.
Figure 5:
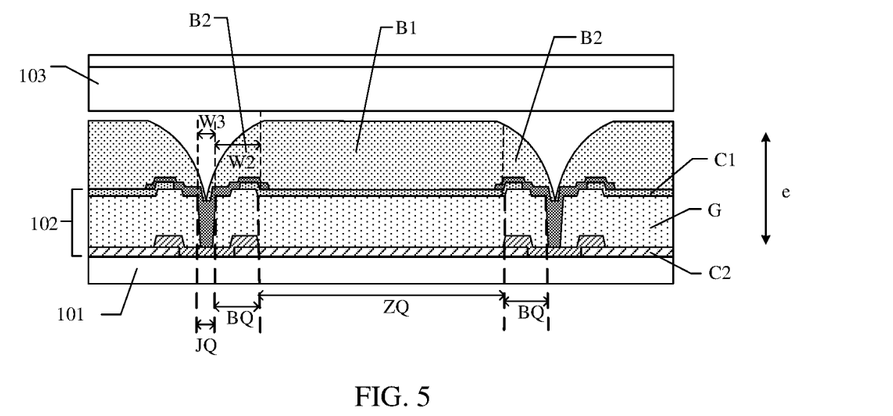
FIG. 5 is a cross-sectional view along a cutting line A-A' illustrated in FIG. 4.

A plane view of a radiation image detector as an embodiment of the present disclosure is shown in FIG. 4, a cross-sectional view along a cutting line A-A' illustrated in FIG. 4 is shown in FIG. 5.

Referring to FIG. 4 and FIG. 5, the radiation image detector comprises an array of the photosensitive pixels P and an array of the light-collecting structure 104, superimposing each other. The light-collecting structure 104 consists essentially a first portion B1 and a second portion B2.

As shown in FIG. 5, the first portion B1 overlaps with the central region ZQ, and the second portion B2 overlaps with both the side wall region BQ and the trench region JQ. The thickness of the second portion B2 gradually decreases from the central region ZQ to the trench region JQ, forming a smooth curved or sloped surface or a surface like a convex lens. Contrary to the curved surface in B2, the surface of the first portion B1 is essentially flat, or in another words its thickness remains essentially equal to the largest thickness of the second portion B2. Therefore, the total thickness of the light collection structure is limited by the thickness of the portion B2, which may be in the range of tens micrometers or even less, the same order of magnitude as the dimensions of the trench region and the side-wall region. Fabrication of the light collecting structure based on a conventional process is therefore readily feasible.

In the embodiment of the present disclosure, the second portion of the light-collecting structure serves as a partial convex lens above the side wall region and the trench region, focusing or guiding those light photons, that would fall into the trench region or the side-wall region, to the central region of the photoelectric conversion layer.

With continued reference to FIG. 5, assume the width of the side wall region BQ is W2, the width of the trench region JQ is W3, and the maximum thickness of the second portion B2 is H, it is preferred that the value of H is in the range from $0.5*(W2+W3)$ to $(W2+W3)$. Beyond this range, either the light collecting structure is too small to efficiently collect the majority of the light photons generated above the trench region and the side-wall region, or the light collecting structure is unnecessarily too large to make the fabrication process complicated and high cost.

Figure 6:
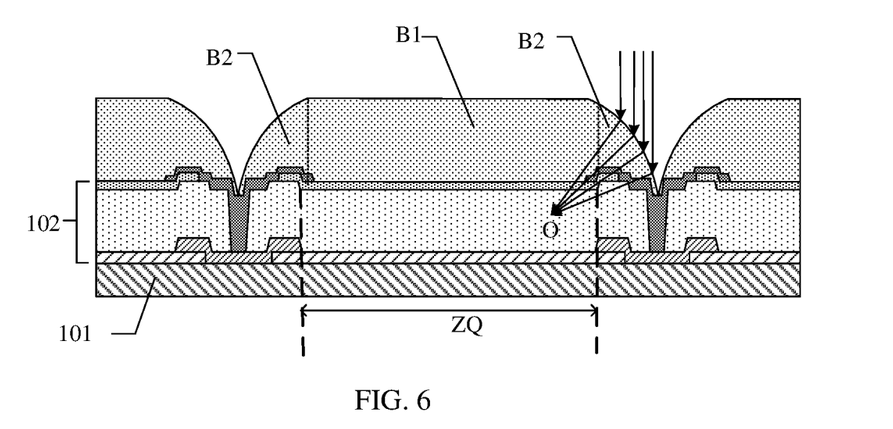
FIG. 6 is a schematic illustrating an optical path of visible light in a radiation image detector after irradiating to a light-collecting structure according to an embodiment of the present disclosure.

As shown in FIG. 4, the second portion B2 of the light collecting structure looks like a ring-shaped convex lens, surrounding the first portion of the light collecting structure B1, with a focal point inside of the central region. FIG. 6 is a schematic diagram of the optical path of visible light while the light photons interacting with the light-collecting structure. As schematically illustrated in FIG. 6, a collimated light beam is refracted at the surface of the light collecting structure and converged into the central region ZQ, ideally at a focal point O. Benefiting from the light collecting structure as described above, the utilization of the incident light increases, improved, those detrimental effects such as image lags are minimized, and finally the image quality is improved.

Figure 7:
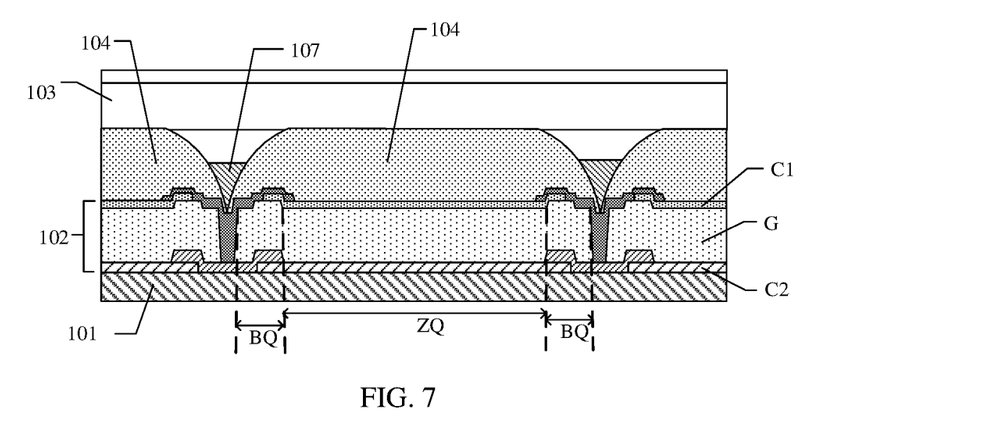
FIG. 7 is a schematic of a radiation image detector according to another embodiment of the present disclosure.
Figure 8:
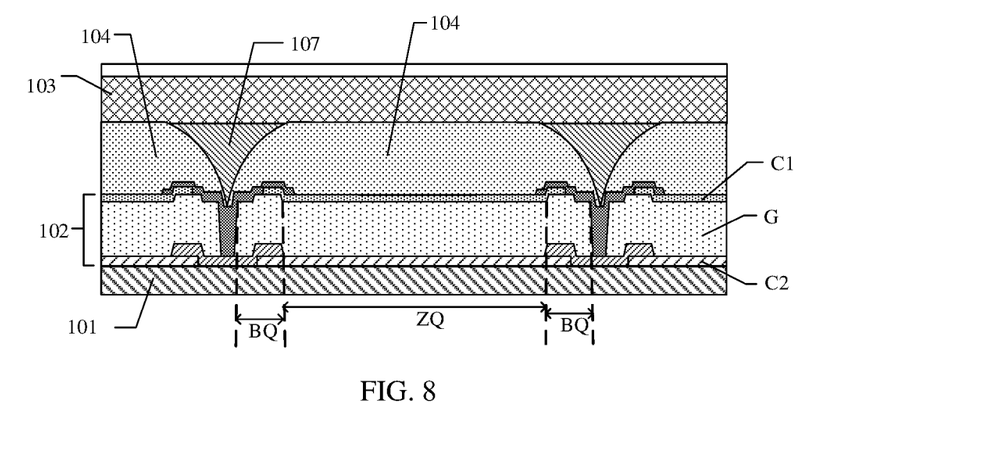
FIG. 8 is a schematic of a radiation image detector according to another embodiment of the present disclosure.

Another two embodiments, which are intended to further improve the image quality of the radiation imaging detector of the present disclosure, are shown in FIG. 7 and FIG. 8, respectively with their cross-sectional views.

As shown in FIG. 7 and FIG. 8, a void would be created after superimposing the radiation conversion layer 103 on the array of the light-collecting structure 104, unless it is filled partially as shown in FIG. 7, or filled completely as shown in FIG. 8. By filling material 107 into the void, the void space shrank significantly or completely vanished. The means disclosed with these two embodiments, greatly reduce the risks of various process residues such as photoresistor, dust and moistures, and therefore increase the reliability of the radiation conversion layer, which might be dissolved gradually with moistures, and the lifetime of the radiation image detectors as well.

Filling the void completely as shown in FIG. 8 may bring another benefit in terms of light collection efficiency. To minimize light reflection at the interface between the radiation conversion layer 103 and the filing unit 107, their indexes of refraction should be as close as possible. However, the index of refraction of the filing material should be less than the index of refraction of the convex lens-like light collection structure, to enable its light focusing functionality. Assume the index of refraction of the filling unit 107 equals to n1, and the refractive index of the light-collecting structure 104 equals to n2, it is preferable to have $n1<n2$.

Figure 9:
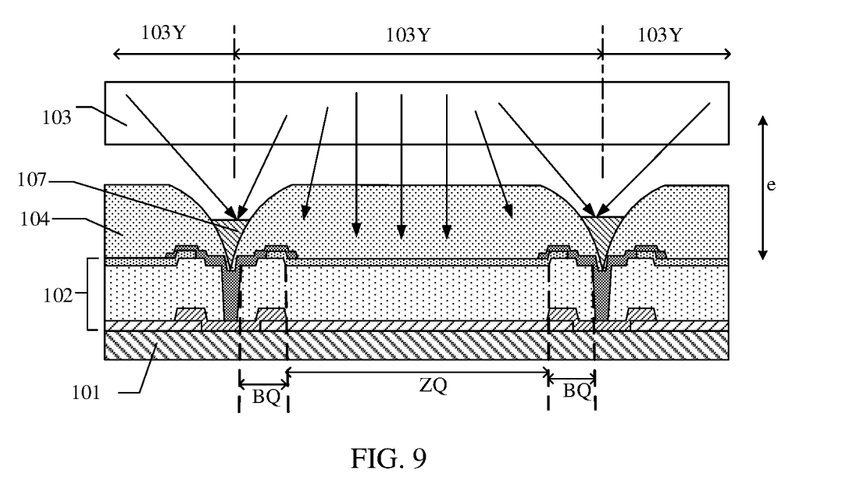
FIG. 9 is a schematic of a radiation image detector according to another embodiment of the present disclosure.

In another embodiment, the filling unit is made of materials including a material opaque to visible light, aiming to improve image MTF. FIG. 9 is a cross-sectional view of a radiation image detector according to the said embodiment. As illustrated in in FIG. 9, the radiation conversion layer 103 can be divided into pixelated blocks, corresponding to each photosensitive image pixel underneath. The visible light photons generated by an X-ray emit in all directions with essentially equal probabilities. Even with collimating effect such as light piping in CsI columnar structure, there are still a large fraction of the visible light photons, traveling in large angles respect to the direction perpendicular to the image sensor array 102 as indicated by an arrow e. Optical crosstalk will occur whenever light photons reach a neighbor pixel, just as the light traces illustrated in FIG. 9. Since the filling unit 107 provided in the embodiment of the present disclosure is opaque to visible light, the visible light traces in large angles will have large chance to be blocked or absorbed by the filling unit 107. Therefore, the arrangement of utilizing the opaque filling unit in the said embodiment can effectively reduce optical cross-talks.

The materials used to make the filling unit includes one of the following or their combinations: an organic material mixed with black particles such as black dyes, carbon powders, carbon nanotubes, or chromium oxide particles.

Figure 10:
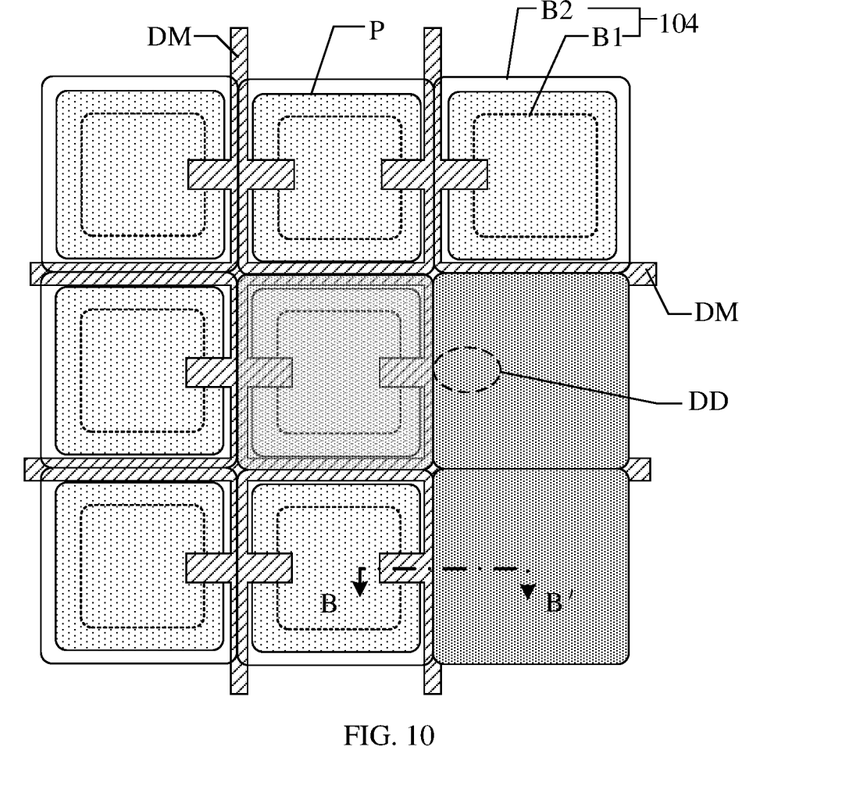
FIG. 10 is a plane view of a radiation image detector according to another embodiment of the present disclosure.
Figure 11:
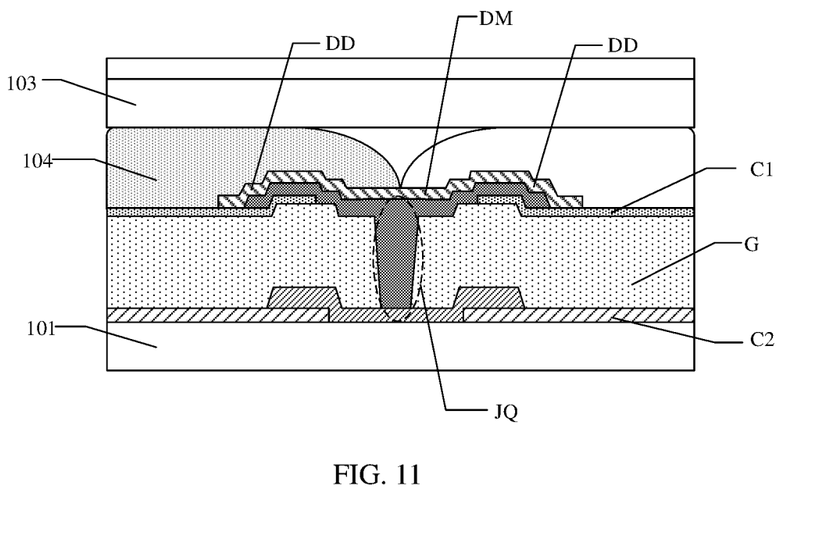
FIG. 11 is a cross-sectional view along a cutting line B-B' illustrated in FIG. 10 according to an embodiment.

FIG. 10 is a plane view of a radiation image detector as another embodiment of the present disclosure, a cross-sectional view along a cutting line B-B' is schematically shown in FIG. 11.

The above are merely exemplary embodiments of the present disclosure, and are not intended to limit the present disclosure. Any modification, equivalent replacement, and improvement made within the spirit and principle of the present disclosure shall be included in the protection scope of the present disclosure.

Finally, it should be noted that the above embodiments are only used to illustrate the technical solutions of the present disclosure, and the present disclosure is limit thereto. Although the present disclosure has been described in detail with reference to the foregoing embodiments, those skilled in the art should understand that modifications can still be made to the technical solutions described in the foregoing embodiments, or equivalent replacements can be made to some or all of the technical features; and the essence of the corresponding technical solutions with these modifications or replacements do not depart from the scope of the technical solutions of the embodiments of the present disclosure.

What is claimed is:

1. A radiation image detector, comprising:
    a substrate;
    an optical image detector located on the substrate, wherein the optical image detector comprises an array comprising a plurality of photosensitive pixels arranged periodically, wherein each of the plurality of photosensitive pixels comprises a first electrode, a photoelectric conversion layer and a second electrode, wherein the first electrode comprises a first contact surface in direct contact with the photoelectric conversion layer, the second electrode comprises a second contact surface in direct contact with the photoelectric conversion layer, and the photoelectric conversion layer comprises a central region and a side wall region, wherein the central region comprises a portion where an orthographic projection of the first contact surface onto the photoelectric conversion layer and an orthographic projection of the second contact surface onto the photoelectric conversion layer overlap with each other, and the side wall region comprises a region of the photoelectric conversion layer other than the central region; and
    a plurality of trench regions in a certain width, insensitive to light and surrounding the plurality of photosensitive pixels of the array;
    a radiation conversion layer located on a side of the optical image detector facing away from the substrate and configured to convert radiation into visible light; and
    a plurality of light-collecting structures pixelated and located between the plurality of photosensitive pixels and the radiation conversion layer, wherein the plurality of light-collecting structures is configured to guide the visible light to the central region, that the visible light would otherwise fall into the side wall region or a trench region between each photosensitive pixels.

2. The radiation image detector according to claim 1, wherein each of the plurality of light-collecting structures comprises a first portion and a second portion, wherein in a direction perpendicular to the substrate, the first portion overlaps with the central region and the second portion overlaps with both the side wall region and the plurality of trench regions; and
    from the central region to the trench region, thickness of the second portion in the direction perpendicular to the substrate gradually decreases while thickness of the first portion in the direction perpendicular to the substrate remains essentially unchanged.

3. The radiation image detector according to claim 2, wherein the second portion of each of the plurality of light-collecting structures has a maximum thickness of H, the side wall region has a width of W2, and each of the plurality of trench regions has a width of W3, where H is greater than or equal to 0.5*(W2+W3), and H is smaller than or equal to (W2+W3).

4. The radiation image detector according to claim 2, wherein the second portion is a ring-shaped convex lens having a focal point inside of the central region.

5. The radiation image detector according to claim 1, wherein in each of the plurality of trench regions and the side wall region, a space is formed between two adjacent light-collecting structures of the plurality of light-collecting structures; and
    wherein the radiation image detector further comprises a filling unit, and at least a part of the space is filled with the filling unit.

6. The radiation image detector according to claim 5, wherein the filling unit is made of a material having a refractive index of n1 in the visible light, and the plurality of light-collecting structures is made of a material having a refractive index of n2 in the visible light, where n1<n2.

7. The radiation image detector according to claim 5, wherein the filling unit is made of materials which is opaque to the visible light.

* * * * *